United States Patent
Zhang et al.

(10) Patent No.: US 11,990,367 B2
(45) Date of Patent: May 21, 2024

(54) APPARATUS AND MEMORY DEVICE INCLUDING CONDUCTIVE LINES AND CONTACTS, AND METHODS OF FORMING AN APPARATUS INCLUDING CONDUCTIVE LINES AND CONTACTS

(71) Applicant: Micron Technology, Inc., Boise, ID (US)

(72) Inventors: Xiaosong Zhang, Boise, ID (US); Yongjun J. Hu, Boise, ID (US); David A. Kewley, Boise, ID (US); Md Zahid Hossain, Boise, ID (US); Michael J. Irwin, Boise, ID (US); Daniel Billingsley, Meridian, ID (US); Suresh Ramarajan, Boise, ID (US); Robert J. Hanson, Boise, ID (US); Biow Hiem Ong, Singapore (SG); Keen Wah Chow, Singapore (SG)

( * ) Notice: Subject to any disclaimer, the term of this patent is extended or adjusted under 35 U.S.C. 154(b) by 268 days.

(21) Appl. No.: 17/444,948

(22) Filed: Aug. 12, 2021

(65) Prior Publication Data

US 2021/0375670 A1 Dec. 2, 2021

Related U.S. Application Data

(63) Continuation of application No. 16/542,507, filed on Aug. 16, 2019, now Pat. No. 11,101,171.

(51) Int. Cl.
*H01L 21/768* (2006.01)

(52) U.S. Cl.
CPC .. *H01L 21/76831* (2013.01); *H01L 21/76843* (2013.01); *H01L 21/76879* (2013.01); *H01L 21/76804* (2013.01)

(58) Field of Classification Search
CPC ......... H01L 21/76831; H01L 21/76843; H01L 21/76879
See application file for complete search history.

(56) References Cited

U.S. PATENT DOCUMENTS

| | | | |
|---|---|---|---|
| 6,060,379 A | 5/2000 | Huang et al. | |
| 6,110,826 A | 8/2000 | Lou et al. | |

(Continued)

FOREIGN PATENT DOCUMENTS

| | | |
|---|---|---|
| CN | 103681466 A | 3/2014 |
| KR | 10-2004-0003491 A | 1/2004 |

OTHER PUBLICATIONS

Chinese Second Office Action for Chinese Application No. 202010810979.4, dated Apr. 25, 2022, 8 pages with translation.

(Continued)

*Primary Examiner* — Jay C Chang
*Assistant Examiner* — Mikka Liu
(74) *Attorney, Agent, or Firm* — TraskBritt (57) ABSTRACT

An apparatus comprises a structure including an upper insulating material overlying a lower insulating material, a conductive element underlying the lower insulating material, and a conductive material comprising a metal line and a contact. The conductive material extends from an upper surface of the upper insulating material to an upper surface of the conductive element. The structure also comprises a liner material adjacent the metal line. A width of an uppermost surface of the conductive material of the metal line external to the contact is relatively less than a width of an uppermost surface of the conductive material of the contact. Related methods, memory devices, and electronic systems are disclosed.

20 Claims, 7 Drawing Sheets

(56) References Cited

U.S. PATENT DOCUMENTS

| | | |
|---|---|---|
| 6,274,923 B1 | 8/2001 | Mikagi |
| 6,348,733 B1 | 2/2002 | Lin |
| 6,534,866 B1 | 3/2003 | Trivedi et al. |
| 6,537,905 B1 | 3/2003 | Chen et al. |
| 6,541,858 B1 | 4/2003 | Farrar |
| 7,319,071 B2 | 1/2008 | Hineman et al. |
| 8,518,825 B1 | 8/2013 | Mao |
| 9,391,020 B2 | 7/2016 | Zhang et al. |
| 9,490,162 B2 | 11/2016 | Kim |
| 9,768,063 B1 | 9/2017 | Kolics et al. |
| 9,786,549 B2 | 10/2017 | Singh et al. |
| 9,824,970 B1 | 11/2017 | Zhang et al. |
| 2002/0089063 A1 | 7/2002 | Ahn et al. |
| 2003/0017696 A1 | 1/2003 | Yen |
| 2005/0085070 A1* | 4/2005 | Park ................. H01L 21/76856 257/E21.586 |
| 2006/0012052 A1 | 1/2006 | McDevitt et al. |
| 2006/0194430 A1* | 8/2006 | Beck ................. H01L 21/76838 257/E21.582 |
| 2007/0161232 A1 | 7/2007 | Bae |
| 2015/0279784 A1 | 10/2015 | Zhang et al. |
| 2017/0278747 A1 | 9/2017 | Adusumilli et al. |

OTHER PUBLICATIONS

Chinese First Office Action for Application No. 202010810979.4, dated Oct. 11, 2021, 18 pages.

\* cited by examiner

APPARATUS AND MEMORY DEVICE INCLUDING CONDUCTIVE LINES AND CONTACTS, AND METHODS OF FORMING AN APPARATUS INCLUDING CONDUCTIVE LINES AND CONTACTS

CROSS-REFERENCE TO RELATED APPLICATION

This application is a continuation of U.S. patent application Ser. No. 16/542,507, filed Aug. 16, 2019, now U.S. Pat. No. 11,101,171, issued Aug. 24, 2021, the disclosure of which is hereby incorporated herein in its entirety by this reference.

TECHNICAL FIELD

Embodiments disclosed herein relate to microelectronic devices and microelectronic device fabrication. More particularly, embodiments of the disclosure relate to apparatuses comprising structures including metal lines that are narrower in width at an uppermost surface of the metal lines external to the contacts than an uppermost surface of contacts and to related methods, memory devices, and electronic systems.

BACKGROUND

A continuing goal of the semiconductor industry has been to increase the memory density (e.g., the number of memory cells per memory die) of memory devices, such as non-volatile memory devices (e.g., NAND Flash memory devices). One way of increasing memory density in non-volatile memory devices is to utilize vertical memory array (also referred to as a "three-dimensional (3D) memory array") architectures. Utilizing narrower metal lines is another way of increasing memory density in such memory devices and associated logic devices (e.g., control logic components) by reducing the amount of real estate consumed by the metal lines.

As technology advances in 3D memory devices, interconnect structures may be fabricated to minimize signal delay and to optimize packing density. Such memory devices may include one or more memory arrays, which may overlie a complementary metal-oxide-semiconductor (CMOS) region, such as CMOS under array (CUA) region. The reliability and performance of integrated circuits may be affected by the quality of their interconnect structures. Advanced multiple metallization materials have been used to accommodate higher packing densities as the size of such devices is reduced. One such metallization scheme is a dual damascene structure formed by a dual damascene process. The dual damascene process is a sequential mask/etch process used to form a two-level structure, such as a contact via electrically connected to a metal line intersected by the contact via.

In contrast to a single damascene process, the contact via and the trench (e.g., of the metal line) may simultaneously be filled with low resistivity metal materials in one or more stages (e.g., steps). Thus, compared to the single damascene process, the dual damascene process offers the advantage of process simplification and lower manufacturing costs.

To form the memory devices according to conventional dual damascene techniques, metal materials are deposited in small openings of the trench of the metal line. However, contact vias are being developed with higher aspect ratios such that obtaining adequate formation of metal within the small openings places ever increasing demands on the methods used to form the memory devices containing metal lines and contact vias, for example, in structures having metal lines in trenches that are narrower in width at an upper edge thereof than an upper edge of contact vias.

DETAILED DESCRIPTION

A microelectronic device (e.g., an apparatus) that includes structures including contact vias and conductive (e.g., metal) lines is disclosed. In some embodiments, the structures of the microelectronic device include an upper insulating material overlying a lower insulating material. A conductive element (e.g., metal pad) may be under the lower insulating material. A conductive material (e.g., an electrically conductive material) comprises metal lines (e.g., within trenches) of the upper insulating material and a contact (e.g., within contact vias) extending through each of the upper and lower insulating materials. The conductive material may extend from an upper surface of the upper insulating material to a surface of the conductive element. The microelectronic device may also include a liner material adjacent (e.g., underlying and/or laterally adjacent) the metal line (e.g., within a trench). A width of the conductive material of an uppermost surface of the metal line external to the contact may be relatively less than a width of the conductive material of an uppermost surface of the contact. The structures may be formed using a so-called "trench first" approach, wherein trenches are formed in the upper insulating material, followed by contact vias being formed in each of the upper insulating material and the lower insulating material. Alternatively, the structures may be formed using a so-called "via first" approach, wherein the contact vias are formed in each of the upper insulating material and the lower insulating material, followed by the trenches being formed in the upper insulating material.

The following description provides specific details, such as material compositions and processing conditions, in order to provide a thorough description of embodiments of the disclosure. However, a person of ordinary skill in the art would understand that the embodiments of the disclosure may be practiced without employing these specific details. Indeed, the embodiments of the disclosure may be practiced in conjunction with conventional semiconductor fabrication techniques employed in the semiconductor industry. In addition, the description provided below does not form a complete process flow for manufacturing a microelectronic device (e.g., a memory device). The structures described below do not form a complete microelectronic device. Only those process stages (e.g., acts) and structures necessary to understand the embodiments of the disclosure are described in detail below. Additional stages to form a complete microelectronic device may be performed by conventional fabrication techniques.

The materials described herein may be formed by conventional techniques including, but not limited to, spin coating, blanket coating, chemical vapor deposition (CVD), atomic layer deposition (ALD), plasma enhanced ALD, or physical vapor deposition (PVD). Alternatively, the materials may be grown. Depending on the specific material to be formed, the technique for depositing or growing the material may be selected by a person of ordinary skill in the art. The removal of materials may be accomplished by any suitable technique including, but not limited to, etching, abrasive planarization (e.g., chemical-mechanical planarization), or other known methods unless the context indicates otherwise.

Drawings presented herein are for illustrative purposes only, and are not meant to be actual views of any particular material, component, structure, device, or system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles that are illustrated may be rounded, and vice versa. Thus, the regions illustrated in the figures are schematic in nature, and their shapes are not intended to illustrate the precise shape of a region and do not limit the scope of the present claims. The drawings are not necessarily to scale. Additionally, elements common between figures may retain the same numerical designation.

As used herein, the singular forms "a," "an," and "the" are intended to include the plural forms as well, unless the context clearly indicates otherwise.

As used herein, "and/or" includes any and all combinations of one or more of the associated listed items.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, the terms "vertical," "longitudinal," "horizontal," and "lateral" are in reference to a major plane of a structure and are not necessarily defined by Earth's gravitational field. A "horizontal" or "lateral" direction is a direction that is substantially parallel to the major plane of the structure, while a "vertical" or "longitudinal" direction is a direction that is substantially perpendicular to the major plane of the structure. The major plane of the structure is defined by a surface of the structure having a relatively large area compared to other surfaces of the structure.

As used herein, the term "configured" refers to a size, shape, material composition, orientation, and arrangement of one or more of at least one structure and at least one apparatus facilitating operation of one or more of the structure and the apparatus in a pre-determined way.

As used herein, reference to an element as being "on" or "over" another element means and includes the element being directly on top of, adjacent to (e.g., laterally adjacent to, vertically adjacent to), underneath, or in direct contact with the other element. It also includes the element being indirectly on top of, adjacent to (e.g., laterally adjacent to, vertically adjacent to), underneath, or near the other element, with other elements present therebetween. In contrast, when an element is referred to as being "directly on" or "directly adjacent to" another element, there are no intervening elements present.

As used herein, the term "critical dimension" refers to dimensions of the smallest geometrical features (e.g., a width of interconnect lines, contacts, trenches, etc.).

As used herein, the term "microelectronic device" includes without limitation a memory device, as well as other devices (e.g., semiconductor devices) which may or may not incorporate memory, such as a logic device, a processor device, or a radiofrequency (RF) device. Further, a microelectronic device may incorporate memory in addition to other functions such as, for example, a so-called "system on a chip" (SoC) including a processor and memory, or a microelectronic device including logic and memory.

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, the term "substrate" means and includes a material (e.g., a base material) or construction upon which additional materials are formed. The substrate may be a semiconductor substrate, a base semiconductor material on a supporting structure, a metal electrode, or a semiconductor substrate having one or more materials, layers, structures, or regions formed thereon. The materials on the semiconductor substrate may include, but are not limited to, semiconductive materials, insulating materials, conductive materials, etc. The substrate may be a conventional silicon substrate or other bulk substrate comprising a layer of semiconductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

FIGS. 1A through 1H illustrate a method of forming a microelectronic device including structures, at various stages of the method, according to some embodiments of this disclosure. The method is a so-called "trench first" method of forming the structures. For simplicity, the formation of two structures is illustrated, but will be understood by one of ordinary skill in the art that the method may include forming multiple (e.g., more than one, an array of) microelectronic devices including such structures. For convenience in describing FIGS. 1A through 1H, a first direction may be defined as a direction, shown in FIGS. 1A through 1E and 1G, as the X-direction. A second direction, which is transverse (e.g., perpendicular) to the first direction, may be defined as a direction in which metal lines extend, shown in FIGS. 1F and 1H, as the Y-direction. A third direction, which is transverse (e.g., perpendicular) to each of the first direction and the second direction, may be defined as a direction (e.g., vertical direction), shown in FIGS. 1A through 1H, as the Z-direction. Similar directions may be defined, as shown in FIGS. 2A through 2H, as discussed in greater detail below.

Figure 1A:
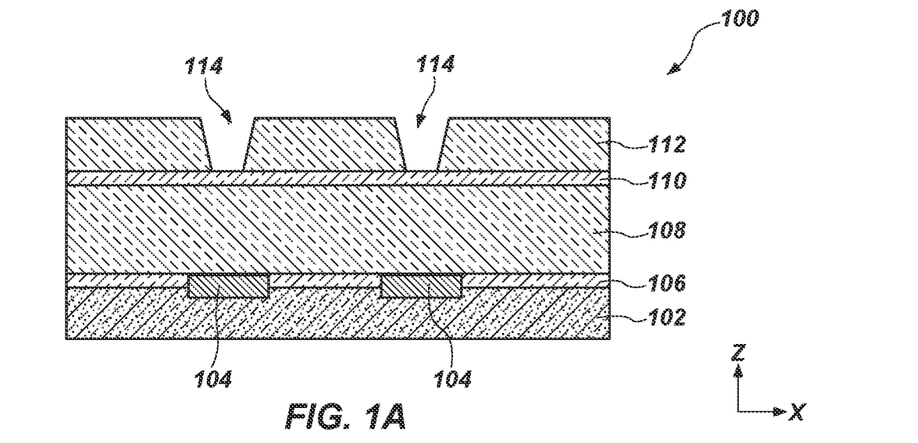
FIGS. 1A-1H are simplified, partial cross-sectional views illustrating various stages of forming a microelectronic device in accordance with embodiments of the disclosure, where simplified, partial cross-sectional views of embodiments A, B, and C of FIG. 1D are taken along section line 1D-1D of the plan views of FIG. 1C.

Referring to FIG. 1A, a partially fabricated microelectronic device 100 includes, adjacent (e.g., over) a base material (not shown), base insulating material 102, conductive element 104 (e.g., conductive pads, metal pads), barrier material 106 formed adjacent (e.g., over) the base insulating material 102, and first insulating material 108 (e.g., an interlayer insulating material) formed adjacent (e.g., over) the barrier material 106. The microelectronic device 100 also includes etch stop material 110 formed adjacent (e.g., over) the first insulating material 108 and second insulating material 112 (e.g., another interlayer insulating material) formed adjacent (e.g., over) the etch stop material 110.

The conductive element 104 may be formed by conventional techniques and may be at least partially embedded within the base insulating material 102 and/or the barrier material 106. For example, a conductive material may be formed over the base insulating material 102 and may be patterned by conventional photolithography techniques to form the conductive element 104. For instance, a photoresist material (not shown) may be formed over the conductive material and patterned by conventional techniques, with the pattern in the photoresist material subsequently transferred to the conductive material. A dry etch process may, for example, be used to form the conductive element 104. In some embodiments, at least a portion of the barrier material 106 may be formed over (e.g., cover) upper surfaces of the conductive element 104. In other embodiments, portions of the barrier material 106 overlying the conductive element 104 are removed to expose upper surfaces of the conductive element 104 such that the upper surfaces of the conductive element 104 are substantially co-planar with an upper surface of the barrier material 106.

The conductive element 104 (e.g., an electrically conductive material) may be formed of a metal, a metal alloy, a metal-containing material, a conductively-doped semiconductor material, or a combination thereof. The conductive element 104 may include, but is not limited to, aluminum, copper, gold, iridium, iridium oxide, molybdenum, molybdenum nitride, nickel, platinum, ruthenium, ruthenium oxide, ruthenium titanium nitride, silver, tantalum, tantalum nitride, tantalum silicide, titanium, titanium nitride, titanium silicide, titanium aluminum nitride, titanium silicon nitride, tungsten, tungsten nitride, tungsten silicide, alloys thereof, combinations thereof, or conductively doped silicon.

Each of the base insulating material 102, the barrier material 106, the first insulating material 108, the etch stop material 110, and the second insulating material 112 may be formed of one or more dielectric materials. The dielectric materials may be formed over a respective underlying material by conventional techniques. For example, the dielectric materials may be formed by spin coating, blanket coating, chemical vapor deposition (CVD), atomic layer deposition (ALD), plasma enhanced ALD, or physical vapor deposition (PVD). In some embodiments, each of the first insulating material 108, the etch stop material 110, and the second insulating material 112 may be formed in a single deposition stage of a dual damascene process.

The dielectric material may include, but is not limited to, silicon oxide or silicon nitride. For example, at least one of (e.g., one or more of) the base insulating material 102, the first insulating material 108, or the second insulating material 112 may be formed of a silicon oxide material. The first insulating material 108 and the second insulating material 112 are separated from one another by the etch stop material 110. The base insulating material 102, the first insulating material 108, and the second insulating material 112 may be formed at a thickness sufficient to electrically isolate electrically conductive materials from one another. Further, each of the first insulating material 108 and the second insulating material 112 may be formed at a sufficient thickness to accommodate thicknesses (e.g., depths) of conductive materials formed therein, as discussed in greater detail below. In some embodiments, the first insulating material 108 may be formed at a thickness of from about 1 μm to about 10 μm, such as from about 1 μm to about 5 μm, or from about 5 μm to about 10 μm, and the second insulating material 112 may be formed at a thickness of from about 1 μm to about 30 μm, such as from about 1 μm to about 15 μm, or from about 15 μm to about 30 μm.

Further, each of the barrier material 106 and the etch stop material 110 may also be formed of a dielectric material including, but not limited to, silicon oxide or silicon nitride. For example, at least one of (e.g., both of) the barrier material 106 or the etch stop material 110 may be formed of a silicon nitride material. The dielectric material of the barrier material 106 and the etch stop material 110 may be selectively etchable relative to the base insulating material 102, the first insulating material 108, and the second insulating material 112. Each of the dielectric material of the barrier material 106 and the etch stop material 110 may differ from materials of, and may react to different etchants than, that of the base insulating material 102, the first insulating material 108, and the second insulating material 112. In some embodiments, the barrier material 106 and the etch stop material 110 may be formed of the same dielectric material (e.g., a silicon nitride material). In other embodiments, the dielectric materials of the barrier material 106 and the etch stop material 110 may differ from one another.

As shown in FIG. 1A, portions of the second insulating material 112 are selectively removed to form trenches 114 corresponding to locations where metal lines of a second level interconnect are ultimately to be formed. The etch stop material 110 substantially prevents the trenches 114 from extending through to the first insulating material 108. The thickness of the second insulating material 112 substantially corresponds to the depth of the trenches 114. The trenches 114 are defined, at least in part, by sidewalls of the second insulating material 112 and may be formed by conventional photolithography techniques. For instance, a photoresist material (not shown) may be formed over the second insulating material 112 and patterned by conventional techniques, with the pattern in the photoresist material subsequently transferred to the second insulating material 112. A dry etch process may, for example, be used to form the trenches 114.

Figure 1B:
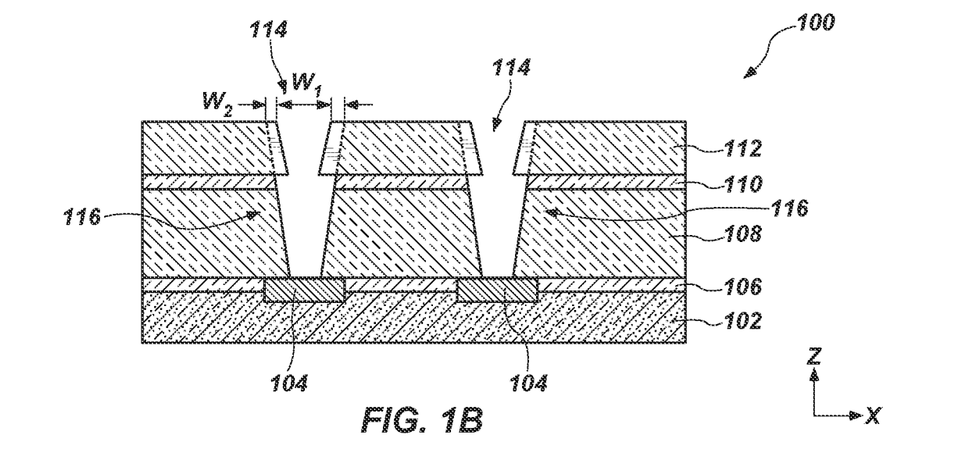

As shown in FIG. 1B, additional portions of the second insulating material 112, the etch stop material 110, and underlying portions of the first insulating material 108 are selectively removed to expose respective portions of the conductive element 104 and to form vias 116 (e.g., openings). The conductive element 104 prevents the vias 116 from extending through to the base insulating material 102. A combined thickness of the first insulating material 108, the etch stop material 110, and the second insulating material 112 substantially corresponds to the depth of the vias 116. In some embodiments, a depth of the vias 116 within the first insulating material 108 is relatively greater than a depth of the trenches 114 within the second insulating material 112. The vias 116 are defined by sidewalls of the second insulating material 112, the etch stop material 110, and the first insulating material 108 and may be formed by conventional photolithography techniques. For instance, the trenches 114 may be used to mask the underlying materials in an etch process, for example. In particular, one or more dry etch processes may be used to form the vias 116. Removal of portions of the first insulating material 108 and the second insulating material 112 may be accomplished using the same etchant employed to remove the etch stop material 110, or using a different etchant. In embodiments where a portion of the barrier material 106 is formed adjacent the conductive element 104, portions of the barrier material 106 are also selectively removed to expose respective portions of the conductive element 104.

As shown in FIG. 1B, the trenches 114 may be defined by sidewalls of the second insulating material 112. Further, an upper edge of the trenches 114 are relatively narrower than an upper edge of the vias 116. In other words, a critical dimension (e.g., a width $W_1$ extending in the X-direction) measured from a top of the trenches 114 external to (e.g., flanking) the vias 116 may be relatively less than a critical dimension (e.g., a width $W_2$ extending in the X-direction) measured from a top of the vias 116.

In some embodiments, each of the trenches 114 and the vias 116 may have a tapered profile with an upper portion of individual trenches 114 and individual vias 116 having a greater critical dimension (e.g., width) than a lower portion thereof. In such embodiments, the trenches 114 may have a top critical dimension (e.g., width) of from about 20 nm to about 100 nm, from about 30 nm to about 100 nm, or from about 30 nm to about 90 nm, and a bottom critical dimension of from about 20 nm to about 90 nm, from about 30 nm to about 90 nm, or from about 30 nm to about 85 nm. Further, the trenches 114 may have a uniform trench depth. The vias 116 may be relatively wider at the top thereof than the top of the trenches 114 and may have a top critical dimension of from about 30 nm to about 120 nm, such as from about 30 nm to about 110 nm, or from about 30 nm to about 100 nm, and a bottom critical dimension of from about 20 nm to about 100 nm, from about 30 nm to about 100 nm, or from about 30 nm to about 95 nm. By way of non-limiting example, aspect ratios (depth:width) of the vias 116 (e.g., extending from a top surface of the second insulating material 112 to a top surface of the conductive element 104) may be between about 3:1 and about 30:1, such as between about 3:1 and about 12:1, between about 3:1 and about 10:1, or between about 3:1 and about 5:1. In other embodiments, at least some of the trenches 114 and/or the vias 116 may have a different profile, for example, an orthogonal (e.g., rectangular) profile, a dish-shaped profile, or any other three-dimensional recess shape.

Figure 1C:
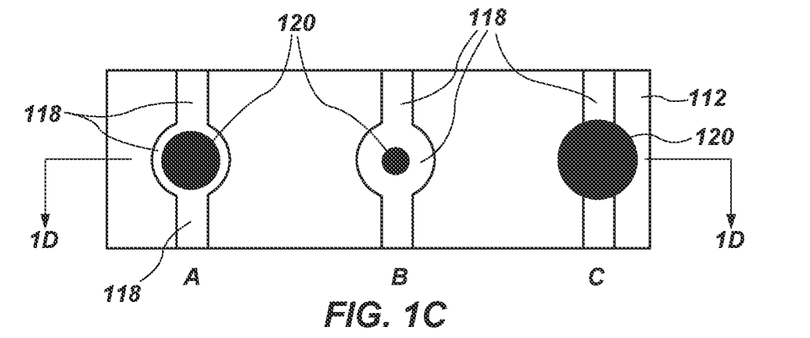
Figure 1D:
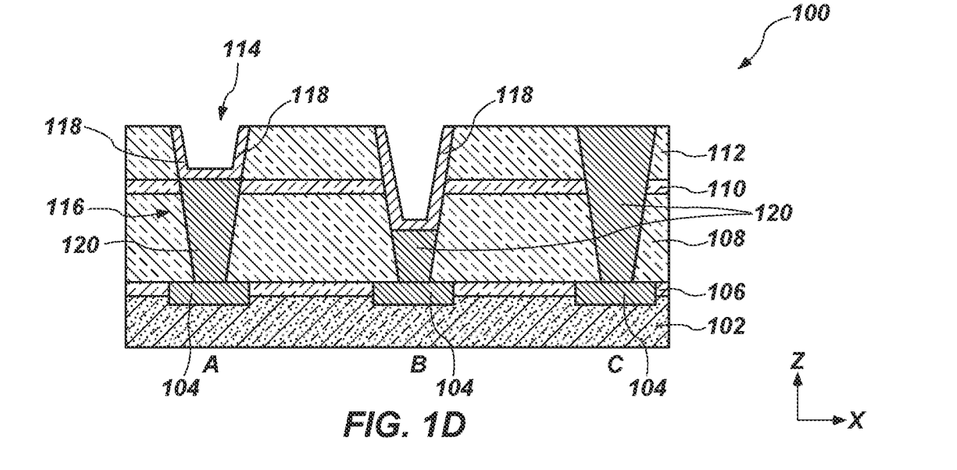

As shown in FIG. 1C in combination with FIG. 1D, one or more conductive materials (e.g., low resistivity metal materials) are formed within openings of the vias 116 and/or portions of the trenches 114 to form a contact 120 (e.g., via plugs) within the vias 116 and/or the trenches 114 in one or more stages. The conductive material of the contact 120 may be a low resistivity metal material including, but not limited to, tungsten or tungsten nitride. Alternatively, the contact 120 may be formed of any other low resistivity metal material, such as, aluminum, copper, molybdenum, noble metals, near-noble metals, or alloys thereof, for example.

A liner material 118 may be formed adjacent (e.g., over) portions of the contact 120 within the vias 116 and/or the trenches 114. In some embodiments, the liner material 118 may be present along portions of sidewalls of the first insulating material 108 and/or the second insulating material 112 without being adjacent (e.g., over) a central portion of the contact 120. Alternatively, the liner material 118 may cover the contact 120 without being present along the sidewalls of either of the first insulating material 108 or the second insulating material 112. In yet other embodiments, the liner material 118 may cover (e.g., substantially entirely cover) the contact 120 as well as being present along substantially entire portions of exposed sidewalls of the first insulating material 108 and/or the second insulating material 112, as shown in the cross-sectional views of FIG. 1D. One of ordinary skill in the art will appreciate that embodiments of the disclosure may also include any combination of the liner material 118 being present along portions of sidewalls and/or bottom portions of the openings. The liner material 118 may be formed of a metal nitride material including, but not limited to, a metal silicon nitride or a metal boron nitride.

Further, placement of the liner material 118 may be dependent upon the extent (e.g., size, location, etc.) of the contact 120 within the openings. In particular, a size (e.g., thickness, depth, etc.) of the contact 120 may vary, as shown in embodiments A, B, and C of FIGS. 1C and 1D, where the cross-sectional views of embodiments A, B, and C of FIG. 1D are taken along section line 1D-1D of the plan views of FIG. 1C. For example, an upper surface of the contact 120 may be substantially aligned with an upper surface of the etch stop material 110, as shown in the cross-sectional view of embodiment A of FIG. 1D. In such embodiments, the liner material 118 may be present only within upper portions of the vias 116 (e.g., along sidewalls of the second insulating material 112) while lower portions of the vias 116 (e.g., sidewalls of the first insulating material 108) are partially or, alternatively, entirely free (e.g., devoid, absent, etc.) of the liner material 118. In other words, the liner material 118 may be formed exclusively above upper surfaces of the etch stop material 110. In addition, the liner material 118 may be present within portions of the trenches 114 external to the openings (e.g., within the trenches 114 flanking the vias 116) such that the liner material 118 is continuous along the metal lines, as shown in the plan view of embodiment A of FIG. 1C.

In other embodiments, an upper surface of the contact 120 may be lower than (e.g., recessed relative to) the etch stop material 110, as shown in the cross-sectional view of embodiment B of FIG. 1D. In other words, portions of the liner material 118 may also be located within at least some of the upper portions of the vias 116. In such embodiments, the liner material 118 may be formed within upper portions of the vias 116 (e.g., along sidewalls of the second insulating material 112) as well as within lower portions of the vias 116 (e.g., along sidewalls of the first insulating material 108). In addition, the liner material 118 may be present within portions of the trenches 114 external to the vias 116 (e.g., within the trenches 114 flanking the vias 116) such that the liner material 118 is continuous along the metal lines, as shown in the plan view of embodiment B of FIG. 1C.

In yet other embodiments, an upper surface of the contact 120 may be substantially aligned with an upper surface of the second insulating material 112, as shown in the cross-sectional view of embodiment C of FIG. 1D. In other words, each of the vias 116 and portions of the trenches 114 overlying the vias 116 may be entirely free of the liner material 118. In such embodiments, the liner material 118 may be present only within portions (e.g., bottom portions and/or sidewalls) of the trenches 114 external to the vias 116 without entirely surrounding conductive materials within the vias 116, as shown in the plan view of embodiment C of FIG. 1C. Further, sidewalls of the first insulating material 108 and/or the second insulating material 112 are partially or, alternatively, entirely free (e.g., devoid, absent, etc.) of the liner material 118 within the vias 116. In other words, the liner material 118 may be present only within portions of the trenches 114 flanking the vias 116 such that portions of the liner material 118 are discontinuous along the metal lines 122.

Further, a majority (e.g., more than half) of the surface area of the sidewalls of the second insulating material 112 may be substantially free (e.g., entirely free) of the liner material 118. By way of non-limiting example, between about 25% and about 50%, such as between about 25% and about 35%, of the surface area of the sidewalls of the second insulating material 112 may be entirely free of the liner material 118. In other words, only between about 50% and about 75%, such as between about 50% and about 65%, of the surface area of the second insulating material 112 may contain the liner material 118. In some embodiments, a size (e.g., thickness, depth, etc.) of the liner material 118 may be dependent, at least in part, on relative sizes of the vias 116 and the trenches 114. In other embodiments, the size of the liner material 118 may be independent of relative sizes of the vias 116 and the trenches 114. Further, the dual damascene processes may be utilized in formation of the microelectronic device 100 without constraint to aspect ratios of the vias 116 in some embodiments. For example, formation of the liner material 118 may be independent of the aspect ratio of the vias 116. In other embodiments, formation of the liner material 118 may be dependent, at least in part, on specific aspect ratios of the vias 116. Thus, dual damascene processes may be utilized in formation of the microelectronic device 100 without constraint to relative critical dimensions (e.g., widths) of the vias 116 and the trenches 114 and without constraint to aspect ratios of the vias 116.

Figure 1E:
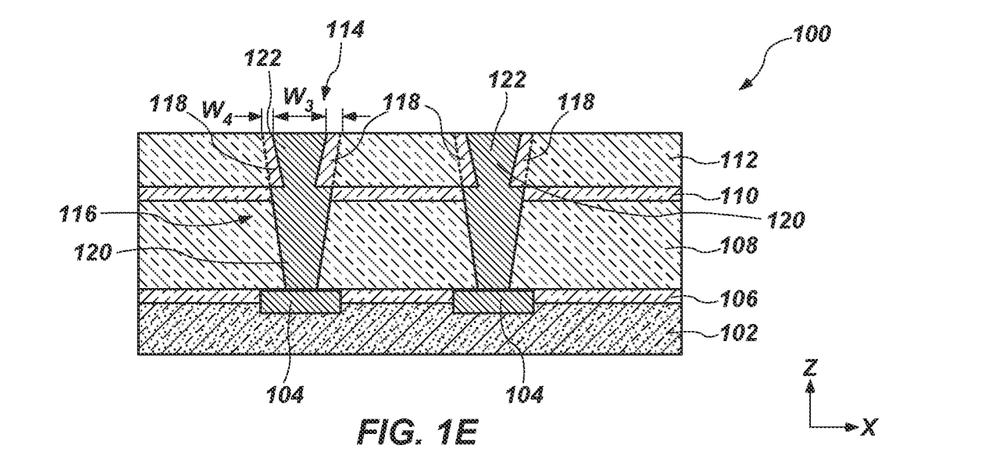

As shown in FIG. 1E, one or more additional portions of the conductive materials (e.g., low resistivity metal materials) are formed within openings of the vias 116 and the trenches 114 to form the contact 120 within the vias 116 and the metal lines 122 within the trenches 114 in one or more stages. The additional portions of the conductive materials (e.g., of the contact 120 and the metal lines 122) may also be a low resistivity metal material including, but not limited to, tungsten or tungsten nitride. Alternatively, the additional portions of the conductive materials may be formed of any other low resistivity metal material, such as, aluminum, copper, molybdenum, noble metals, near-noble metals, or alloys thereof, for example. The conductive materials in each of the vias 116 and the trenches 114 may be the same or different.

In some embodiments, the vias 116 and the trenches 114 may be simultaneously filled with the conductive material in a single stage. In other words, the conductive material may be deposited to substantially fill the vias 116 and the trenches 114 in a single deposition stage. For example, a dual damascene process including a single stage (e.g., cycle) of film deposition of insulating materials, two stages of photoresist patterning and etching processes (e.g., for the vias 116 and the trenches 114) and one stage of CMP processing may be employed. In other embodiments, the vias 116 and the trenches 114 may be substantially filled with the conductive material in two deposition stages. In such embodiments, portions of the contact 120 may be formed by selective metal deposition in the vias 116, as discussed in greater detail above with reference to FIGS. 1C and 1D, followed by formation of the liner material 118 within portions (e.g., bottom portions and/or sidewalls) of the trenches 114 and within portions of the vias 116, and thereafter additional portions of the contact 120 and/or the metal lines 122 may be formed in another (e.g., a subsequent) deposition stage using, for example, conventional deposition techniques. In other words, the first insulating material 108 and the second insulating material 112 may be formed in a single deposition process, followed by deposition of the conductive material. Thereafter, upper portions of the conductive material above an upper surface of the second insulating material 112 may be removed (e.g., by CMP processing) without removing upper portions of the conductive material above an upper surface of the first insulating material 108 prior to forming the second insulating material 112. In contrast to dual damascene processes, single damascene processes generally require two stages of film deposition, two stages of photoresist patterning and etching processes, and two stages of CMP processing. Prior to forming the metal lines 122 within the trenches 114, exposed surfaces of the contact 120 may be cleaned using a selective etchant, for example, to provide a rough (e.g., textured) surface thereon to allow (e.g., promote) growth of metal materials (e.g., the liner material 118) thereon, without the need for two stages of CMP processing.

The contact 120 and the metal lines 122 may be formed using chemical vapor deposition (CVD) or physical vapor deposition (PVD), for example. The contact 120 and/or the metal lines 122 may, alternatively, or additionally, be formed using selective CVD deposition using conventional techniques. Such selective deposition processes may be utilized to reduce (e.g., prevent) the conductive materials becoming "pinched off" at the interface of the contact 120 and the metal lines 122 and may be utilized to reduce the occurrence of voids, gaps, etc. within or adjacent to the conductive materials. Further, the liner material 118 may be grown in situ within the trenches 114 and/or the vias 116. For example, the liner material 118 may be formed by selective CVD deposition process in an epitaxial "bottom-up" growth of CVD metal within the trenches 114 and/or the vias 116 using the conductive material of the contact 120, for example, as a reactant upon at least a portion of such conductive materials being exposed. In particular, such conductive material may be electrically conductive to supply electrons needed for decomposition of a metal precursor gas and the resulting deposition of the metal material. Thus, formation of the liner material 118 within the trenches 114 and/or the vias 116 may be used to reduce the potential for incidence of voids, gaps, etc. occurring during the dual damascene process between adjacent regions of the conductive material and to improve metal-to-metal contact therebetween without allowing (e.g., promoting) buildup of the conductive material along the sidewalls of the second insulating material 112, for example, within openings having a small critical dimension and/or high aspect ratio.

As shown in FIG. 1E, portions of each of the etch stop material 110 and the first insulating material 108 underlying the second insulating material 112 may be laterally recessed relative to the liner material 118 such that regions of each of the etch stop material 110 and the first insulating material 108 undercut the second insulating material 112 and/or the liner material 118. In other words, portions of the second insulating material 112 and/or the liner material 118 may extend farther into the upper portions of the vias 116 relative to sidewalls of the etch stop material 110 and/or the first insulating material 108. Further, portions of the second insulating material 112 and/or the liner material 118 may provide sidewalls for at least a portion of the upper portions of the vias 116 such that uppermost surfaces of the metal lines 122 external to (e.g., flanking) the contact are relatively narrower than uppermost surfaces of the contact 120. In other words, a critical dimension (e.g., a width $W_3$ extending in the X-direction) measured from an uppermost surface of the metal lines 122 external to the contact may be relatively less than a critical dimension (e.g., a width $W_4$ extending in the X-direction) measured from an uppermost surface of the contact 120. By way of non-limiting example, a width of an uppermost surface of each of the metal lines 122 external to the contact 120 is between about 15 percent and about 95 percent of a width of an uppermost surface of the contact 120, such as between about 25 percent and about 85 percent, or between about 35 percent and about 75 percent. Stated another way, a width of the uppermost surface of each of the metal lines 122 external to the contact 120 is between about 5 nm and about 10 nm less than a width of the uppermost surface of the contact 120, for example. In particular, the liner material 118 may be positioned and configured to reduce the formation of voids within the vias 116 proximate the sidewalls of the etch stop material 110 and/or sidewalls of the first insulating material 108 (e.g., within undercut regions of portions of the second insulating material 112 and/or the liner material 118) when the conductive materials are formed within the vias 116 and the trenches 114.

In contrast, conventional dual damascene processes form conventional structures having trenches that are wider at a top thereof than the width of a top of the contact vias. For example, a width of a top of a contact via may be between about 45 percent and about 85 percent of a width of a top of a trench in conventional structures. The wider trenches enable direct line of sight to the contact vias, which are relatively narrower at a top thereof than a top of the trenches in such conventional structures. However, using dual damascene processes in the microelectronic device 100 including forming trenches 114 that are relatively narrower at the top thereof than a top of the vias 116 may increase the potential for incidence of voids, gaps, etc. in the conductive materials, and specifically at the interface of the contact 120 and the metal lines 122. Thus, the liner material 118 as disclosed herein may be positioned and configured to reduce (e.g., prevent) the occurrence of such voids, gaps, etc. in order to allow adequate metal-to-metal contact between the contact 120 and the metal lines 122 at an interface thereof. Further, the liner material 118 may be positioned and configured such that insulation properties may be enhanced in selected regions (e.g., between adjacent metal lines 122). One of ordinary skill in the art will appreciate that embodiments of the disclosure may also be used to form conventional structures having trenches that are wider at a top thereof than a top of contact vias.

Further, one or more of the openings may be lined with additional materials (e.g., seed materials, diffusion barrier materials, etc.) to ensure proper electrical connection between the contact 120 and the metal lines 122 in some embodiments. In other embodiments, each of the openings, including the vias 116 and the trenches 114 may be entirely free of seed materials and diffusion barrier materials. In other words, the conductive material of the metal lines 122 may be in direct contact (e.g., direct physical contact) with each of the second insulating material 112 and of the contact 120. Further, the contact 120 may be in direct contact (e.g., direct physical contact) with each of the second insulating material 112, the first insulating material 108, and the conductive element 104.

Figure 1F:
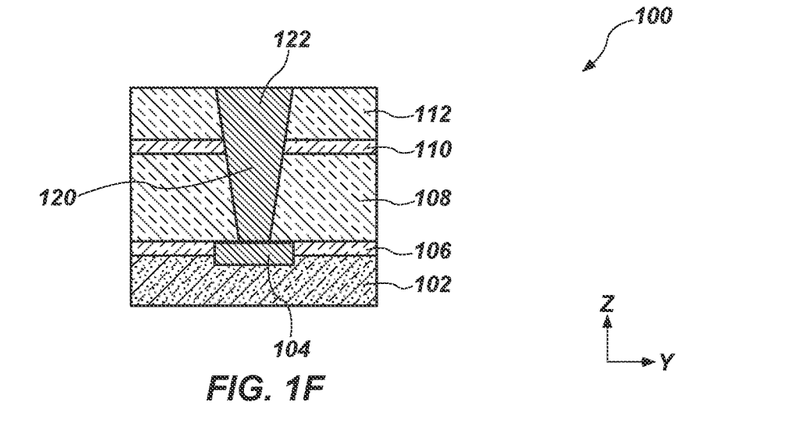

FIG. 1F is a cross-sectional view of the microelectronic device 100 along the Y-direction at the stage of formation shown in FIG. 1E. As shown in FIG. 1F, portions of the metal lines 122 within the vias 116 may be formed to substantially extend (e.g., fully extend) between the sidewalls of the second insulating material 112 at this stage of formation when viewed from the Y-direction.

Figure 1G:
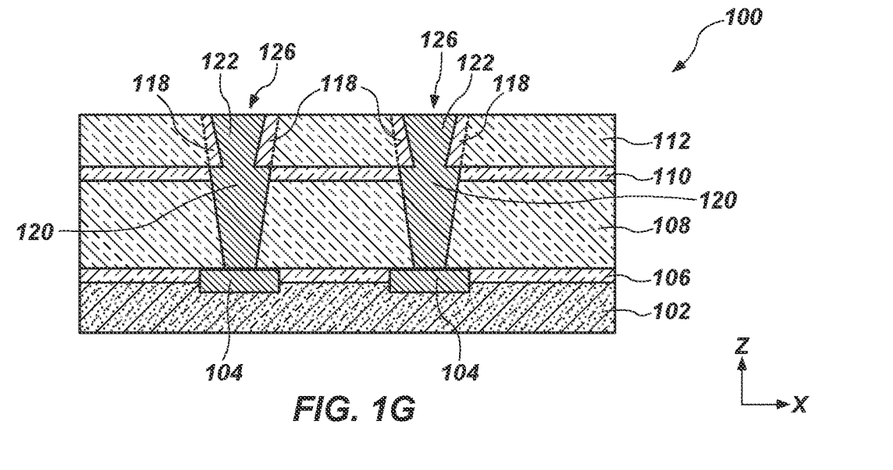

As shown in FIG. 1G, formation of the contact 120 and the metal lines 122 results in formation of conductive structures 126 coupling one of the metal lines 122 with the contact 120 within one or more of the vias 116. In other words, a composite structure including the contact 120 and the metal lines 122 together form the conductive structures 126 using a dual damascene process including selective deposition of conductive materials including the metal nitride material (e.g., the liner material 118) that may be grown in situ, for example, in the bottom of at least one of the openings (e.g., the trenches 114) using conductive materials (e.g., the contact 120) underlying a least a portion of the conductive material.

Figure 1H:
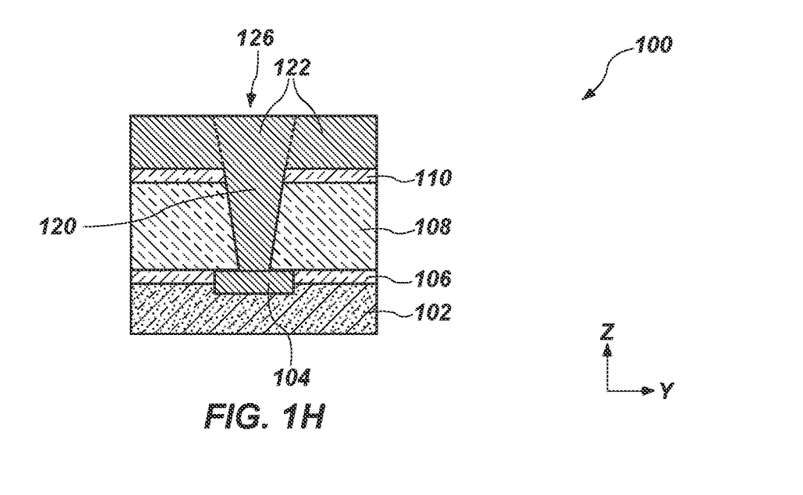

FIG. 1H is a cross-sectional view of the microelectronic device 100 along the Y-direction at the stage of formation shown in FIG. 1G. Portions of the trenches 114 external to (e.g., flanking) the vias 116 (FIG. 1B) may be formed over the etch stop material 110 and may be separated from one another by remaining portions of the second insulating material 112 (shown in FIG. 1G) to form the metal lines 122 therein. A dry etch process may, for example, be used to form openings (not shown) in the second insulating material 112 using conventional techniques. The metal lines 122 may then be formed within such openings using conventional techniques. As discussed above, the metal lines 122 may be formed of a low resistivity metal material similar to that of the contact 120 (e.g., tungsten or tungsten nitride). Alternatively, the metal lines 122 may be formed of any other low resistivity metal material, such as, aluminum, copper, molybdenum, or alloys thereof, for example. The metal lines 122 may be connected (e.g., electrically connected) with the contact 120, as viewed from the Y-direction of FIG. 1H. Thereafter, a chemical mechanical planarization (CMP) process may be conducted to remove portions of conductive material extending over upper surfaces of the second insulating material 112, while leaving desired portions of such conductive material within the trenches 114 and the vias 116 (FIG. 1B). In this manner, the second insulating material 112 may act as an etch stop layer during the CMP stage. The portions of the metal lines 122 flanking the vias 116 may connect conductive materials of individual conductive structures 126, including portions of the metal lines 122 within the vias 116 and the contact 120, as well as the conductive element 104, to other conductive structures within the microelectronic device 100. The planarized surface of the microelectronic device 100 allows for subsequent metallization to build multilevel interconnect structures. Subsequent process stages may be conducted by conventional techniques, which are not described herein, to complete formation of the microelectronic device 100, as well as microelectronic devices containing such structures. Thus, the microelectronic device 100 may be fabricated using a dual damascene process including a single stage (e.g., cycle) of film deposition of insulating materials, two stages of photoresist patterning and etching processes (e.g., for the vias 116 and the trenches 114), deposition of conductive materials in one or two stages, and one stage of CMP processing. In contrast, single damascene processes generally require two stages of film deposition of insulating materials, two stages of photoresist patterning and etching processes, and two stages of CMP processing.

Accordingly, a method of forming an apparatus is disclosed. The method comprises forming a trench in an upper insulating material overlying a lower insulating material, and forming a contact via in the upper insulating material and the lower insulating material. The contact via intersects portions of the trench and extends from an upper surface of the upper insulating material to an exposed surface of a conductive element under the contact via. A width of an upper edge the contact via is greater than a width of an upper edge of the trench. The method also comprises forming a conductive material in the contact via, forming a liner material within the trench, and forming the conductive material in the trench.

FIGS. 2A through 2H illustrate a method of forming a microelectronic device structure including dual damascene structures, at various stages of the method, according to additional embodiments of this disclosure. The method is a so-called "via first" method of forming the dual damascene structures.

Figure 2A:
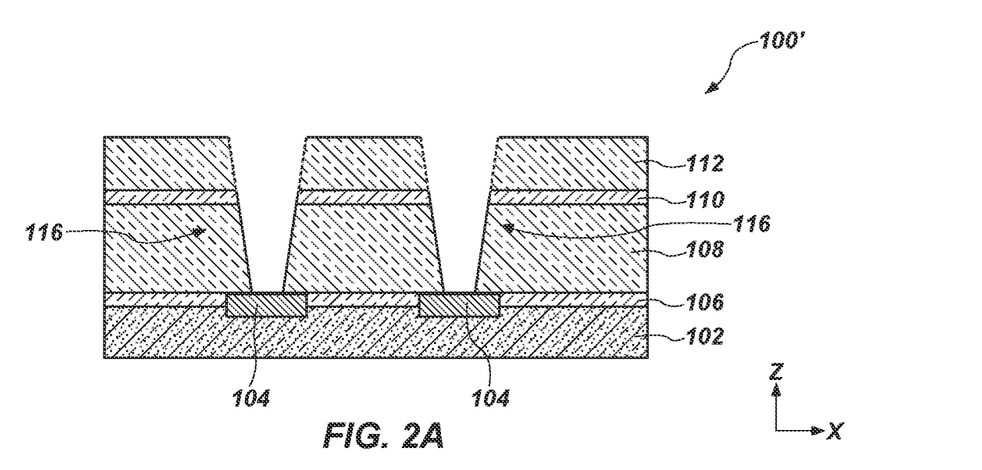
FIGS. 2A-2H are simplified, partial cross-sectional views illustrating various stages of forming a microelectronic device in accordance with additional embodiments of the disclosure, where simplified, partial cross-sectional views of embodiments A, B, and C of FIG. 2D are taken along section line 2D-2D of the plan views of FIG. 2C.

Referring to FIG. 2A, a partially fabricated microelectronic device 100' includes, adjacent (e.g., over) a base material (not shown), the base insulating material 102, the conductive element 104, the barrier material 106 formed adjacent (e.g., over) the base insulating material 102, and the first insulating material 108 formed adjacent (e.g., over) the barrier material 106. The microelectronic device 100' also includes an optional etch stop material 110 formed adjacent (e.g., over) the first insulating material 108 and the second insulating material 112 formed adjacent (e.g., over) the optional etch stop material 110. Many portions of the microelectronic device 100', such as the conductive materials of the conductive element 104 and the dielectric materials of the base insulating material 102, the barrier material 106, the first insulating material 108, the optional etch stop material 110, and the second insulating material 112, as well as dimensions thereof, may be the same as those included in the embodiments of the microelectronic device 100 of FIGS. 1A through 1H. Further, such conductive materials and dielectric materials are formed (e.g., deposited) using processes that are the same as those used in the previous embodiments. As in the previous embodiment, the first insulating material 108 is formed adjacent (e.g., over) the barrier material 106, which, in turn, is formed adjacent (e.g., over) the base insulating material 102. Further, the optional etch stop material 110, if present, is formed adjacent (e.g., over) the first insulating material 108 and the second insulating material 112 is formed thereover. Thereafter, the vias 116 may be formed in each of the second insulating material 112, the optional etch stop material 110, and the first insulating material 108. As in the previous embodiment, the vias 116 are defined by sidewalls of the second insulating material 112, the optional etch stop material 110, if present, and the first insulating material 108 and may be formed by conventional photolithography techniques using a photoresist material followed by a dry etch process, for example, as discussed in greater detail above with reference to FIG. 1B.

Figure 2B:
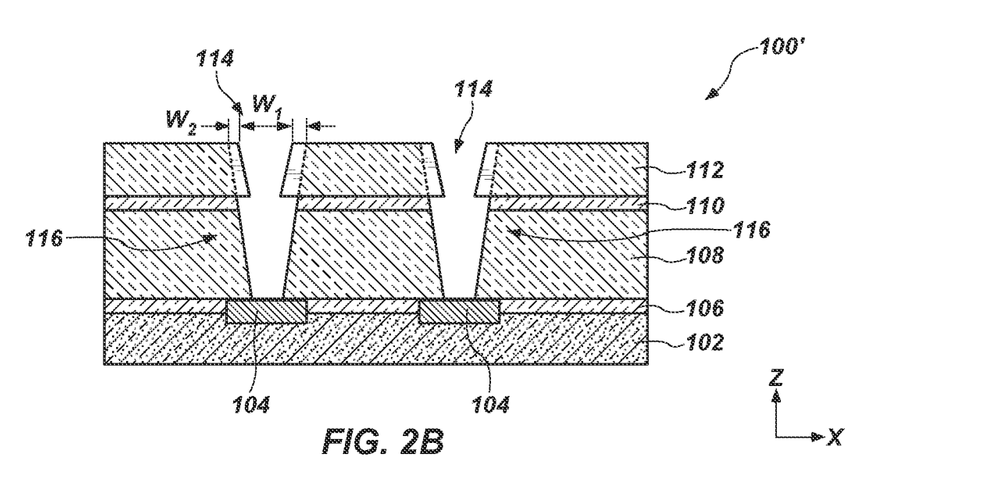

As shown in FIG. 2B, additional portions of the second insulating material 112 are selectively removed to form the trenches 114, in which conductive material is subsequently formed to produce the metal lines 122 of the second level interconnect. In such embodiments, the trenches 114 may be formed subsequent to formation of the vias 116. The trenches 114 are at least partially defined by sidewalls of the second insulating material 112 and may be formed by conventional photolithography techniques using a photoresist material followed by a dry etch process, for example, as discussed in greater detail above with reference to FIG. 1A. As in the previous embodiment, an upper edge of the trenches 114 is relatively narrower than an upper edge of the vias 116.

Figure 2C:
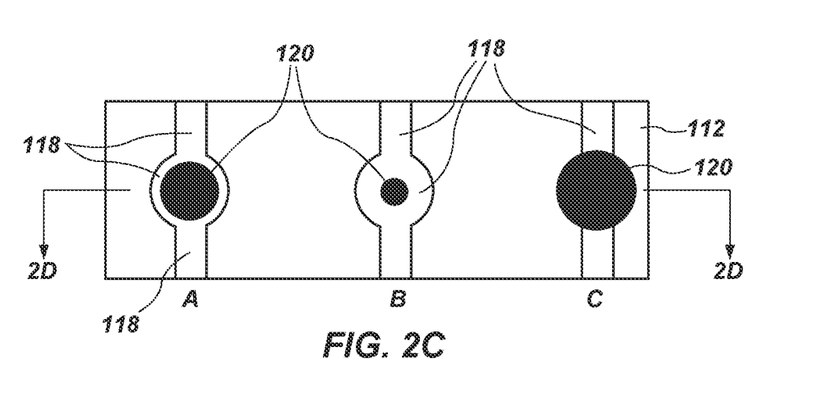
Figure 2D:
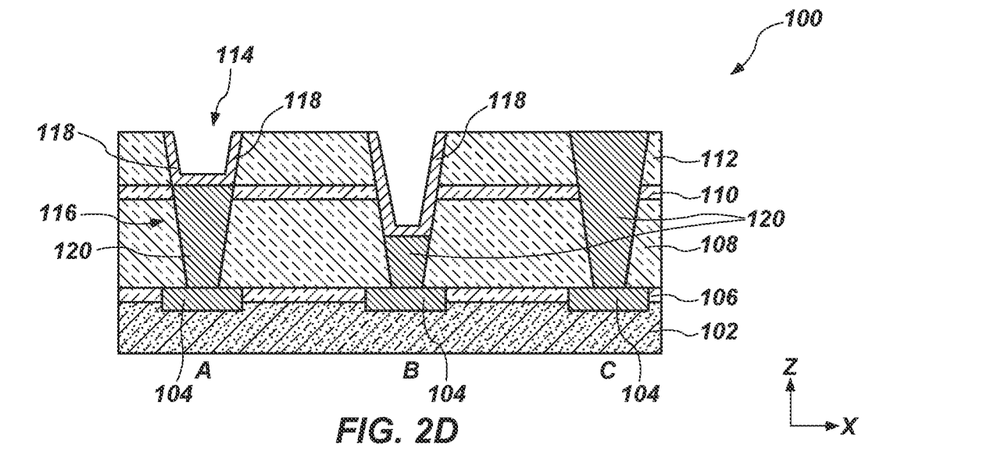

As shown in FIG. 2C in combination with FIG. 2D, one or more conductive materials (e.g., low resistivity metal materials) are formed within portions of the openings of the vias 116 to form contact 120 (e.g., via plugs) within the vias 116 and metal lines 122 within the trenches 114 in one or more stages. The liner material 118 may be formed adjacent (e.g., over) portions of the contact 120 within portions of the vias 116 and/or the trenches 114. Placement of the liner material 118 may be dependent upon extent (e.g., size, location, etc.) of the contact 120 within the openings, as discussed in greater detail above with reference to FIGS. 1C and 1D. In particular, a size (e.g., thickness, depth, etc.) of the contact 120 may vary, as shown in embodiments A, B, and C of FIGS. 2C and 2D, where the cross-sectional views of embodiments A, B, and C of FIG. 2D are taken along section line 2D-2D of the plan views of FIG. 2C.

Figure 2E:
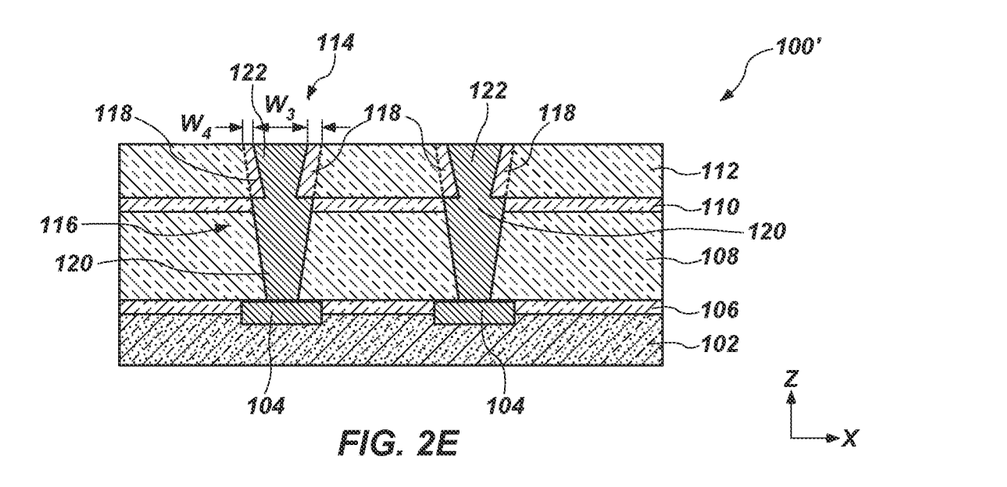

As shown in FIG. 2E, one or more additional portions of the conductive materials (e.g., low resistivity metal materials) are formed within openings of the vias 116 and the trenches 114 to form the contact 120 within the vias 116 and the metal lines 122 within the trenches 114 in one or more stages. For example, the vias 116 and the trenches 114 may be substantially simultaneously filled with such conductive materials or, alternatively, filled with the conductive materials in two deposition stages of a dual damascene process, as discussed in greater detail above with reference to FIG. 1E. The additional portions of the conductive materials of the contact 120 and the metal lines 122 may be a low resistivity metal material including, but not limited to, tungsten or tungsten nitride. Further, the conductive materials may be formed using CVD or PVD deposition processes and/or using selective CVD deposition in which the liner material 118 may be grown in situ, for example, within the trenches 114 and/or the vias 116. For example, the liner material 118 may be formed by selective CVD deposition process in an epitaxial "bottom-up" growth of CVD metal within the trenches 114 and/or the vias 116 using the conductive material of the contact 120, for example, as a reactant. Thus, formation of the liner material 118 within the trenches 114 and/or the vias 116 may be used to reduce the potential for incidence of voids, gaps, etc. occurring during the dual damascene process between adjacent regions of the conductive materials and to improve metal-to-metal contact therebetween without allowing (e.g., promoting) buildup of the conductive material along the sidewalls of the second insulating material 112, for example, within openings having a small critical dimension and/or high aspect ratio. Further, locations and dimensions of material may be substantially similar (e.g., the same) as those discussed in the previous embodiment.

Figure 2F:
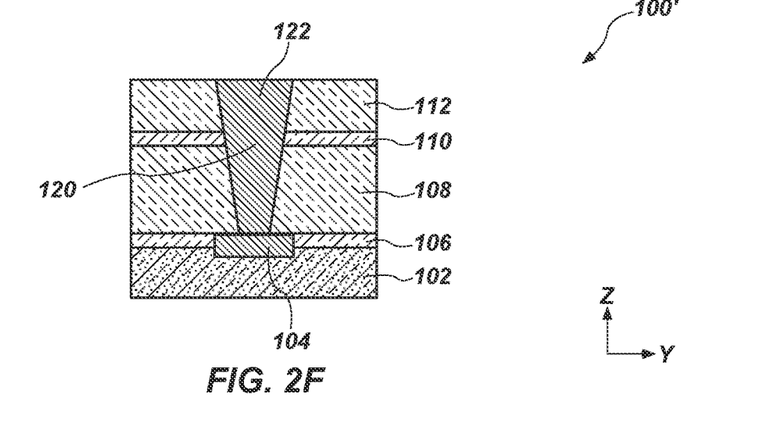

FIG. 2F is a cross-sectional view of the microelectronic device 100' along the Y-direction at the stage of formation shown in FIG. 2E. As shown in FIG. 2F, portions of the metal lines 122 within the vias 116 may be formed to substantially extend (e.g., fully extend) between the sidewalls of the second insulating material 112 at this stage of formation when viewed from the Y-direction.

Figure 2G:
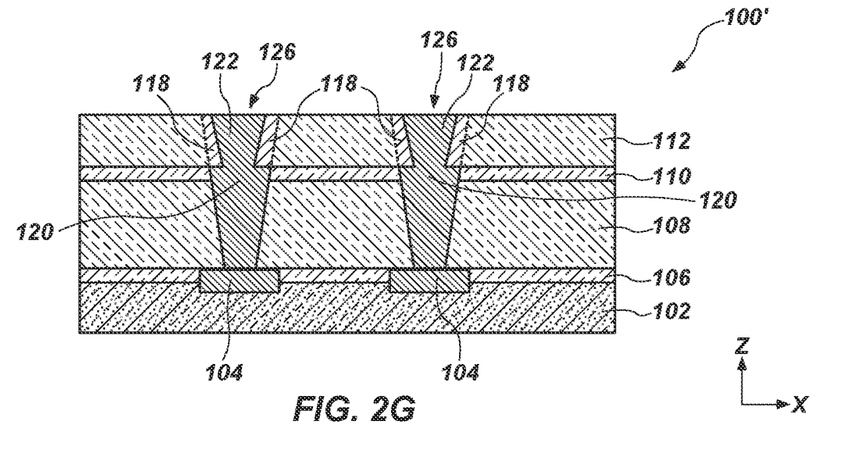

As shown in FIG. 2G, formation of the contact 120 and the metal lines 122 results in formation of the conductive structures 126, including the contact 120 (e.g., via plug) and the metal lines 122, as discussed in greater detail above with reference to FIG. 1G. Thus, the composite structure of the contact 120 and the metal lines 122 together form the conductive structures 126 using a dual damascene process including selective deposition of conductive materials including the metal nitride material (e.g., the liner material 118) that may be grown in situ, for example, in the bottom of at least one of the openings (e.g., the trenches 114) using conductive materials (e.g., the contact 120).

Figure 2H:
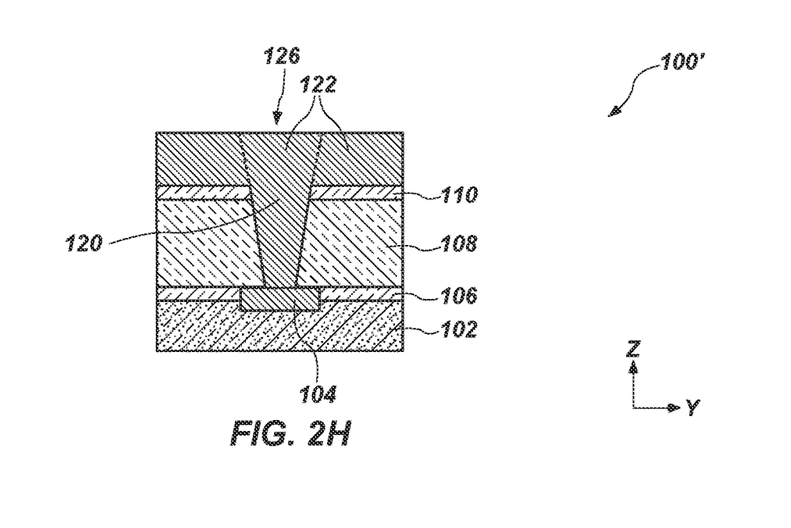

FIG. 2H is a cross-sectional view of the microelectronic device 100' along the Y-direction at the stage of formation shown in FIG. 2G. As in the previous embodiment, the portions of the trenches 114 external to (e.g., flanking) the vias 116 (FIG. 2B) may be formed adjacent the etch stop material 110 and may be separated from one another by remaining portions of the second insulating material 112 (shown in FIG. 2G) to form the metal lines 122 therein. Thereafter, a chemical mechanical planarization (CMP) process may be conducted to provide a planarized surface for subsequent metallization to build multilevel interconnect structures and for subsequent process stages to complete formation of the microelectronic device 100'.

Accordingly, a method of forming an apparatus is disclosed. The method comprises forming a contact via in a first insulating material and a second insulating material to expose a conductive element underlying the first insulating material, forming a trench in the second insulating material. An upper edge of the trench is narrower than an upper edge of the contact via. The method also comprises forming a first portion of a conductive material within the contact via, forming a liner material within the trench, and forming a second portion of the conductive material in the trench.

The resulting structure of the microelectronic device 100' of FIGS. 2A through 2H may be substantially similar (e.g., the same) as that of the microelectronic device 100 of FIGS. 1A through 1H. Thus, whether a "trench first" or a "via first" approach to the dual damascene process integration is used, a microelectronic device (e.g., an apparatus) that includes dual damascene structures including metal lines external to the contact that are relatively narrower at the uppermost surface thereof than the uppermost surface of contacts may be fabricated without constraint to relative critical dimensions of the contact vias and the trenches and without requiring the use of single damascene processes. Further, the liner material 118 may be formed by selective CVD deposition process in an epitaxial "bottom-up" growth of CVD metal within the trenches 114 and/or the vias 116, for example, to reduce (e.g., prevent) the occurrence of voids in order to allow adequate metal-to-metal contact between the conductive materials, including contact vias having high aspect ratios. The dual damascene processes and resulting structures disclosed herein may include a sequential (e.g., two-stage) mask/etch process to form a two-level structure, such as a contact via intersecting two flanking trenches that are relatively narrower at an upper edge thereof than an upper edge of the contact via. Thus, dual damascene processes provide an improvement over single damascene processes by allowing the trenches and the contact vias to be filled prior to planarization, thus eliminating process stages while avoiding unnecessary waste of conductive materials.

Accordingly, an apparatus is disclosed. The apparatus comprises a structure including an upper insulating material overlying a lower insulating material, a conductive element underlying the lower insulating material, and a conductive material comprising a metal line and a contact. The conductive material extends from an upper surface of the upper insulating material to an upper surface of the conductive element. The structure also comprises a liner material adjacent the metal line. A width of an uppermost surface of the conductive material of the metal line external to the contact is relatively less than a width of an uppermost surface of the conductive material of the contact.

Figure 3:
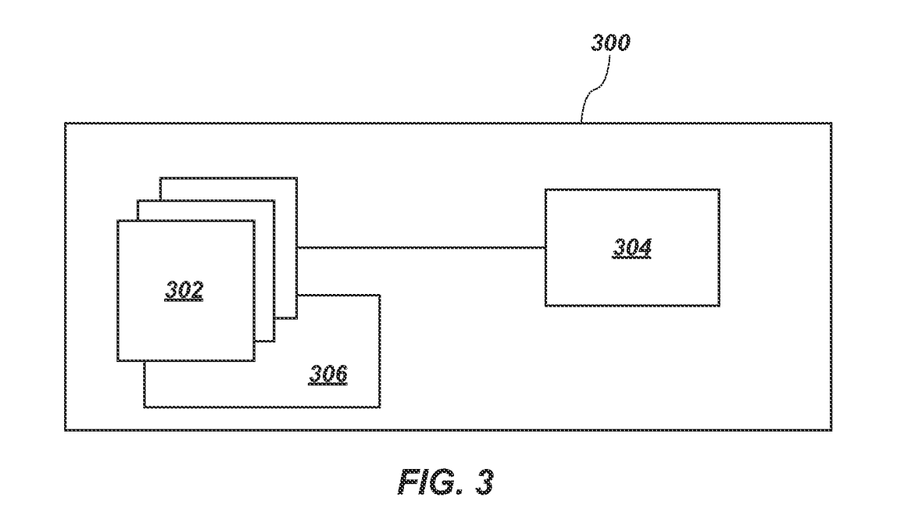
FIG. 3 is a schematic block diagram illustrating a memory device including one or more of the microelectronic devices in accordance with embodiments of the disclosure.

The microelectronic devices 100, 100' according to embodiments of the disclosure may be used in a memory device 300 that includes one or more memory arrays 302 of memory cells. The memory device 300 (e.g., a DRAM device, a 3D NAND Flash memory device) is shown schematically in the functional block diagram of FIG. 3. The memory device 300 includes the memory arrays 302 of memory cells of one or more microelectronic devices 100, 100' and a control logic component 304. The control logic component 304 may be configured to operatively interact with the memory array 302 so as to read, write, or re-fresh any or all memory cells within the memory arrays 302. For example, the memory device 300 may include the memory arrays 302, which may include a complementary metal-oxide-semiconductor (CMOS) region, such as CMOS under array (CUA) region 306 underlying the memory arrays 302. The memory arrays 302 may include memory cells that are connected to access lines (e.g., word lines) and data lines (e.g., bit lines). Further, the CUA region 306 may underlie the memory arrays 302 and include support circuitry thereof. The support circuitry may support one or more additional arrays of memory cells present in a stacked configuration. For example, the memory device 300, including the memory array 302 having memory cells, can be two-dimensional (2D) so as to exhibit a single deck (e.g., a single tier, a single level) of the memory cells, or can be three-dimensional (3D) so as to exhibit multiple decks (e.g., multiple levels, multiple tiers) of the memory cells. In a stacked configuration, the CUA region 306 may facilitate accessing one or more memory cells in each array. For example, the CUA region 306 may facilitate the transfer of data between a memory cell coupled to a channel of a memory array 302, a memory cell coupled to a channel of an additional memory array 302 that is coupled to memory array 302, and a controller.

Accordingly, a memory device comprises a first insulating material adjacent metal pads, a second insulating material adjacent the first insulating material, and a structure comprising a conductive material comprising a metal line extending through the second insulating material and a contact extending through the first insulating material and the second insulating material. The metal line is intersected by the contact. An aspect ratio of the contact is between about 3:1 and about 12:1. The memory device also comprises a liner material adjacent the metal line. The conductive material is in direct contact with each of the first insulating material, the second insulating material, and the metal pads.

Figure 4:
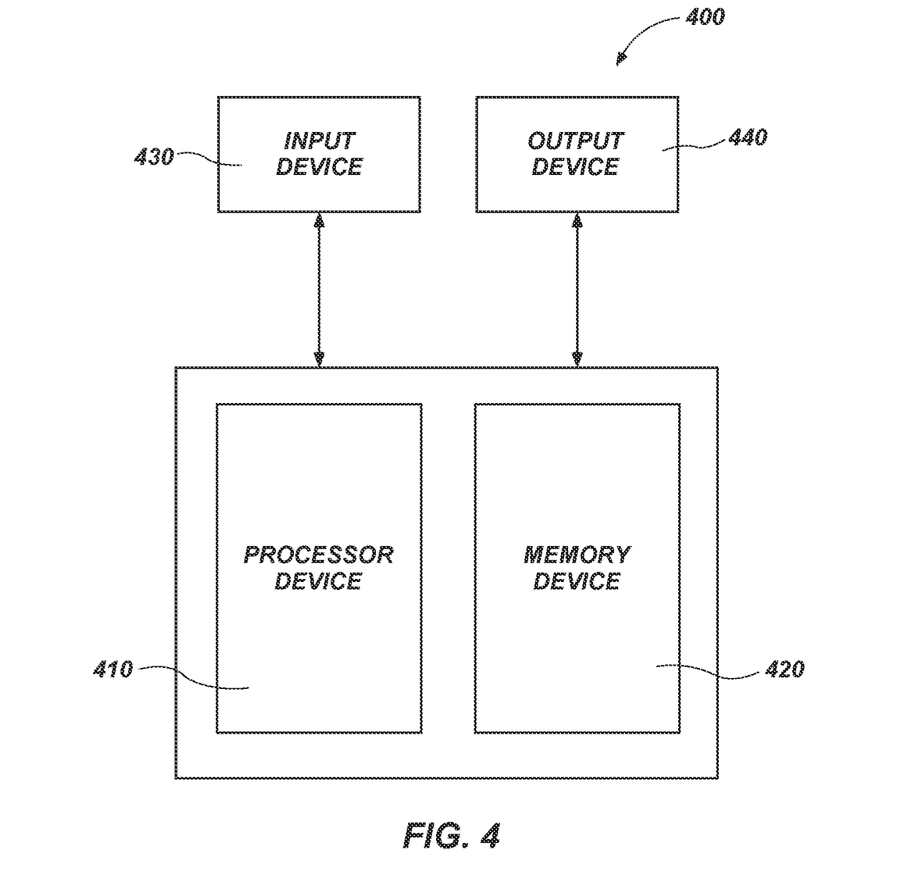
FIG. 4 is a schematic block diagram of an electronic system, in accordance with embodiments of the disclosure.

Microelectronic devices including device structures (e.g., the microelectronic devices 100, 100') in accordance with embodiments of the disclosure may be used in embodiments of electronic systems of the disclosure. For example, FIG. 4 is a block diagram of an illustrative electronic system 400 according to embodiments of disclosure. The electronic system 400 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an IPAD® or SURFACE® tablet, an electronic book, a navigation device, etc. The electronic system 400 includes at least one memory device 420. The memory device 420 may include, for example, an embodiment of a microelectronic device (e.g., microelectronic devices 100, 100') previously described herein. The electronic system 400 may further include at least one electronic signal processor device 410 (often referred to as a "microprocessor"). The electronic signal processor device 410 may, optionally, include an embodiment of a microelectronic device previously described herein (e.g., the microelectronic devices 100, 100'). The electronic system 400 may further include one or more input devices 430 for inputting information into the electronic system 400 by a user, such as, for example, a mouse or other pointing device, a keyboard, a touchpad, a button, or a control panel. The electronic system 400 may further include one or more output devices 440 for outputting information (e.g., visual or audio output) to a user such as, for example, a monitor, a display, a printer, an audio output jack, a speaker, etc. In some embodiments, the input device 430 and the output device 440 may comprise a single touchscreen device that can be used both to input information to the electronic system 400 and to output visual information to a user. The input device 430 and the output device 440 may communicate electrically with one or more of the memory device 420 and the electronic signal processor device 410.

Accordingly, an electronic system comprising a processor device operably coupled to an input device and an output device and a memory device operably coupled to the processor device is disclosed. The memory device comprises memory cells, at least one of which comprises a structure including an upper insulating material overlying a lower insulating material, a conductive element underlying the lower insulating material, and a conductive material comprising a metal line and a contact. The conductive material extends from an upper surface of the upper insulating material to an upper surface of the conductive element. The structure also comprises a liner material adjacent the metal line. A width of an uppermost surface of the conductive material of the metal line external to the contact is relatively less than a width of an uppermost surface of the conductive material of the contact.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure.

What is claimed is:

1. An apparatus comprising:
    conductive elements underlying an insulative material;
    conductive lines operably coupled to the conductive elements; and
    contacts intersecting the conductive lines and extending from upper surfaces of the conductive lines to upper surfaces of the conductive elements with the contacts directly adjacent to the insulative material and the conductive elements, an outer diameter of the contacts at an elevation of the upper surfaces of the conductive lines is greater than a width of the conductive lines external to the contacts.

2. The apparatus of claim 1, further comprising a liner material laterally adjacent to the conductive lines and overlying portions of the contacts.

3. The apparatus of claim 2, wherein the liner material comprises a metal nitride material located on opposing sides of the conductive lines.

4. The apparatus of claim 1, further comprising an etch stop material overlying the insulative material and an additional insulative material overlying the etch stop material, the conductive lines and upper portions of the contacts laterally adjacent to the additional insulative material.

5. The apparatus of claim 4, wherein portions of the conductive lines are directly adjacent to the additional insulative material.

6. The apparatus of claim 1, wherein the conductive lines and the contacts comprise the same material.

7. The apparatus of claim 1, wherein openings comprising the conductive lines and the contacts are entirely free of seed materials and diffusion barrier materials.

8. A method of forming an apparatus, comprising:
    forming an insulative material over conductive elements;
    forming contacts comprising a first portion of a conductive material directly adjacent to the insulative material and the conductive elements; and
    forming conductive lines operably coupled to the conductive elements, the conductive lines intersected by the contacts and comprising a second portion of the conductive material, the contacts extending from upper surfaces of the conductive lines to upper surfaces of the conductive elements with an outer diameter of the contacts at an elevation of the upper surfaces of the conductive lines being greater than a width of the conductive lines external to the contacts.

9. The method of claim 8, further comprising forming trenches in an upper portion of the insulative material overlying a lower portion of the insulative material and thereafter forming contact vias extending entirely through the upper portion and the lower portion of the insulative material, the trenches containing the conductive lines and the contact vi as containing the contacts.

10. The method of claim 9, wherein forming the insulative material comprises forming the upper portion and the lower portion thereof in a single deposition stage of a dual damascene process.

11. The method of claim 8, further comprising forming contact openings extending from an upper surface of the insulative material to the upper surfaces of the conductive elements and thereafter forming conductive line trenches in the insulative material.

12. The method of claim 8, further comprising selectively forming a metal nitride material on an upper surface of the first portion of the conductive material of the contacts prior to forming the conductive lines.

13. The method of claim 8, wherein forming the contacts and forming the conductive lines comprises forming conductive structures comprising a continuous portion of the conductive material.

14. The method of claim 8, wherein forming the contacts and forming the conductive lines comprises forming the conductive material in one or more stages after forming an entirety of the insulative material.

15. The method of claim 8, wherein forming the contacts comprises removing upper surfaces of the first portion of the conductive material of the contacts after forming the conductive lines, without removing the upper surfaces of the first portion of the conductive material prior to forming the conductive lines.

16. A memory device, comprising:
    conductive elements;
    conductive lines extending in a horizontal direction over the conductive elements; and
    contacts vertically intersecting the conductive lines and extending from upper surfaces of the conductive lines to upper surfaces of the conductive elements, wherein the upper surfaces of the conductive lines external to the contacts are relatively narrower than upper surfaces of the contacts, and wherein openings comprising the conductive lines and the contacts are entirely free of seed materials and diffusion barrier materials.

17. The memory device of claim 16, wherein the contacts exhibit a tapered profile with an upper portion of individual contacts having a greater critical dimension than a lower portion of the individual contacts.

18. The memory device of claim 16, further comprising at least one array of memory cells and a complementary metal-oxide-semiconductor (CMOS) under array (CUA) region vertically aligned with the at least one array of memory cells.

19. The memory device of claim 16, further comprising a liner material comprising a metal silicon nitride or a metal boron nitride adjacent to the conductive lines in regions flanking the contacts.

20. The memory device of claim 19, wherein a portion of the liner material intervenes between the conductive lines and the contacts.

* * * * *

UNITED STATES PATENT AND TRADEMARK OFFICE
CERTIFICATE OF CORRECTION

| | | Page 1 of 1 |
|---|---|---|
| PATENT NO. | : 11,990,367 B2 | |
| APPLICATION NO. | : 17/444948 | |
| DATED | : May 21, 2024 | |
| INVENTOR(S) | : Xiaosong Zhang et al. | |

It is certified that error appears in the above-identified patent and that said Letters Patent is hereby corrected as shown below:

In the Specification

Column 5,　　Line 7,　　change "insulator ("SOT") substrates," to
　　　　　　　　　　　　　　--insulator ("SOI") substrates,--

In the Claims

Claim 9,　　Column 18,　　Line 63,　　change "contact vi as containing" to
　　　　　　　　　　　　　　　　--contact vias containing--

Signed and Sealed this
Twenty-fourth Day of December, 2024

Derrick Brent
*Acting Director of the United States Patent and Trademark Office*